United States Patent
Akaike et al.

(10) Patent No.: US 8,581,671 B2
(45) Date of Patent: *Nov. 12, 2013

(54) OSCILLATION DEVICE

(75) Inventors: Kazuo Akaike, Sayama (JP); Shinichi Sato, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 10 days.

This patent is subject to a terminal disclaimer.

(21) Appl. No.: 13/356,764

(22) Filed: Jan. 24, 2012

(65) Prior Publication Data

US 2012/0194280 A1    Aug. 2, 2012

(30) Foreign Application Priority Data

Jan. 28, 2011    (JP) .................................. 2011-017179

(51) Int. Cl.
*H03B 5/36*    (2006.01)

(52) U.S. Cl.
USPC ................. 331/158; 331/116 FE; 331/116 R; 331/176

(58) Field of Classification Search
USPC .......................... 331/158, 116 R, 116 FE, 176
See application file for complete search history.

(56) References Cited

U.S. PATENT DOCUMENTS 5,200,714 A * 4/1993 Hayashi .......................... 331/66
5,214,668 A    5/1993 Satou et al.
6,545,550 B1   4/2003 Frerking

FOREIGN PATENT DOCUMENTS

| GB | 2 251 143 | 6/1992 |
|----|-----------|--------|
| JP | 59-095431 | 6/1984 |
| JP | 2001-292030 | 10/2001 |

OTHER PUBLICATIONS

U.S. Appl. No. 13/353,942 Akaike et al, filed Jan. 24, 2012.*

* cited by examiner

*Primary Examiner* — Arnold Kinkead
(74) *Attorney, Agent, or Firm* — Jordan and Hamburg LLP

(57) ABSTRACT

An oscillation device capable of highly accurate temperature compensation of an output frequency is provided. The oscillation device includes: first and second oscillator circuits oscillating first and second quartz-crystal resonators with overtones respectively; a frequency difference detecting part finding a value corresponding to a difference value between values corresponding to differences between f1 and f1r and between f2 and f2r, where f1 and f2 are oscillation frequencies of the first and second oscillator circuits, and f1r and f2r are oscillation frequencies of the first and second oscillator circuits at a reference temperature; and a correction value obtaining part which, based on the value corresponding to the difference value and a relation between the value corresponding to the difference value and a frequency correction value of the oscillation frequency f1, obtains the frequency correction value of f1, wherein the output frequency is corrected based on the found frequency correction value.

8 Claims, 13 Drawing Sheets

(a) OUTPUT OF DDS, LATCH POINT (b) OUTPUT OF LATCH (c) OUTPUT OF LOOP FILTER (a) OUTPUT OF DDS, LATCH POINT (b) OUTPUT OF LATCH (c) OUTPUT OF LOOP FILTER (a)

(b)

PRIOR ART

OSCILLATION DEVICE

BACKGROUND OF THE INVENTION

1. Field of the Invention

The present invention relates to an oscillation device detecting temperature under which a quartz-crystal resonator is placed and performing temperature compensation of an output frequency based on a result of the temperature detection.

2. Description of the Related Art

TCXO is called a temperature-compensated quartz-crystal oscillator, and by combining a temperature characteristic that a quartz-crystal resonator has and an opposite circuit characteristic, it can have a better temperature characteristic over a wide temperature range than that obtained with the characteristic of only the quartz-crystal resonator. Further, not only having such a good temperature characteristic but also having advantages of its compact size, light weight, short activation time, and the like, the TCXO is used as reference oscillators in various kinds of communication devices and measuring devices such as a frequency counter and a synthesizer.

TCXO has a temperature compensation circuit including a temperature sensitive element, and as the temperature compensation circuit, available are one using a thermistor as the temperature sensitive element and having the combination of a resistor and a capacitor, and one using an element in an LSI as the temperature sensitive element. These TCXOs have merits and demerits in view of temperature compensation accuracy, phase noise, and easiness of downsizing, depending on such a difference in the structure of the temperature compensation circuit.

FIG. 13 shows an ordinary structure of the TCXO. 90 denotes a quartz-crystal resonator and 91 denotes an oscillator circuit, and by changing a control voltage supplied from a control voltage generating part 93 to a voltage variable capacitance element 92, a capacitance of the voltage variable capacitance element 92 is controlled, so that an oscillation frequency (output frequency) is adjusted.

Since the frequency of the quartz-crystal resonator 90 changes according to temperature, the control voltage generating part 93 corrects the control voltage according to a temperature detected by a temperature detector 94. Concretely, for example, a cubic function which is a function being a frequency-temperature characteristic of the quartz-crystal resonator 90 normalized on a reference temperature, is stored in a memory 95, and based on this function (frequency-temperature characteristic), a frequency corresponding to a temperature detection value is read. That is, to what degree the frequency at the detected temperature deviates from the frequency at the reference temperature is read, and a control voltage corresponding to this frequency deviation amount is subtracted as a temperature compensation amount from a control voltage corresponding to the frequency at the reference temperature. As structures of such TCXO, there have been known an H-type structure in which a quartz-crystal resonator and an IC chip including a temperature detecting element are provided on both surfaces of a ceramic substrate respectively, a single seal structure in which a quartz-crystal resonator and an IC chip including a temperature detecting element are provided in a casing, and so on.

However, in the above-described TCXO as well, frequency stability sometimes deteriorates due to a temperature characteristic of the quartz-crystal resonator 90 and a temperature characteristic of a quartz-crystal oscillator circuit composed of the quartz-crystal resonator and the oscillator circuit 91, which has created a demand for an oscillation device higher in frequency accuracy. Further, a thermistor is generally used as the temperature detector 94, and due to its limitation in temperature detection accuracy, improvement in frequency accuracy cannot be expected. Further, since the temperature detector 94 and the quartz-crystal resonator 90 are disposed at different positions, it is not possible to accurately obtain actual temperature information of the quartz-crystal resonator 90, and because of this, improvement in frequency accuracy cannot be expected, either.

Further, the aforesaid temperature compensation amounts at respective temperatures are set for each TCXO. As a method of setting this temperature compensation amount, a thermostatic oven is prepared in a production line, and when TCXO being a target product is loaded therein, its frequency is measured while temperature in the oven is varied, and the temperature compensation amounts are individually set. Before this frequency measurement, it is necessary to wait until the temperature of the TCXO becomes constant after the temperature in the oven is varied. Therefore, it takes a long time to manufacture the TCXO.

Patent Document 1 describes, in FIG. 2 and FIG. 3, that two pairs of electrodes are provided on a common quartz-crystal piece to form two quartz-crystal oscillators (quartz-crystal resonators). Further, it describes, in paragraph 0018, that a frequency difference occurs between the two quartz-crystal resonators according to a temperature change and therefore measuring the frequency difference is equivalent to measuring the temperature. Further, Patent Document 1 describes, in paragraph 0054, paragraph 0055, and FIG. 6, that a fundamental frequency f1 and an $M^{th}$ overtone frequency fm which are taken out from one quartz-crystal resonator do not necessarily satisfy f1=fm/M due to a difference in vibration mode, and a frequency difference Δf having temperature dependency occurs between f1 and fm/M. Then, a relation between the frequency difference Δf and a frequency correction amount is stored in a ROM and the frequency correction amount is read based on Δf.

However, as described in paragraph 0019, this method requires the adjustment of the quartz-crystal resonators so that a desired output frequency f0 and frequencies f1, f2 of the two quartz-crystal resonators have a relation of f0≈f1≈f2, and thus has a problem that a manufacturing process of the quartz-crystal resonators becomes complicated and a high yield cannot be obtained. Further, since clocks being frequency signals from the respective quartz-crystal resonators are counted for a predetermined time and a difference therebetween (f1−f2) is found as shown in FIG. 4, the detection time has a direct influence on detection accuracy, which makes highly accurate temperature compensation difficult. Further, since the fundamental and the overtone are taken out from the single quartz-crystal resonator, the circuit becomes complicated and there is a concern about interference between an $M^{th}$ spurious component of the fundamental and fm.

[Patent Document 1] Japanese Patent Application Laid-open No. 2001-292030

SUMMARY OF THE INVENTION

The present invention was made under such circumstances and has an object to provide an oscillation device capable of highly accurate temperature compensation of an output frequency.

The present invention is an oscillation device correcting an output frequency based on a detection result of an environmental temperature, the oscillation device including:

a first quartz-crystal resonator including a first electrode provided on a quartz-crystal piece;

a second quartz-crystal resonator including a second electrode provided on a quartz-crystal piece;

a first oscillator circuit connected to the first quartz-crystal resonator to oscillate the first quartz-crystal resonator with an overtone;

a second oscillator circuit connected to the second quartz-crystal resonator to oscillate the second quartz-crystal resonator with an overtone;

a frequency difference detecting part finding a value corresponding to a difference value between a value corresponding to a difference between f1 and f1r and a value corresponding to a difference between f2 and f2r, where f1 is an oscillation frequency of the first oscillator circuit, f1r is an oscillation frequency of the first oscillator circuit at a reference temperature, f2 is an oscillation frequency of the second oscillator circuit, and f2r is an oscillation frequency of the second oscillator circuit at the reference temperature; and a correction value obtaining part which, based on the value corresponding to the difference value detected by the frequency difference detecting part and a relation between the value corresponding to the difference value and a frequency correction value of the oscillation frequency f1 of the first oscillator circuit, obtains the frequency correction value of f1 ascribable to a difference between the environmental temperature and the reference temperature, wherein an output of the first oscillator circuit is used to generate an output of the oscillation device, and wherein, based on the frequency correction value found by the correction value obtaining part, the output frequency is corrected.

The value corresponding to the difference value between the value corresponding to the difference between f1 and f1r and the value corresponding to the difference between f2 and f2r is, for example, $[\{(f2-f2r)/f2r\}-\{(f1-f1r)/f1r\}]$.

The correction value obtaining part can be structured to obtain the frequency correction value of f1 by calculation based on a relational expression defining the relation between the value corresponding to the difference value and the frequency correction value of the oscillation frequency f1 of the first oscillator circuit.

In the oscillation device, for example, an order of the overtone oscillated by the first oscillator circuit and an order of the overtone oscillated by the second oscillator circuit are equal to each other, and the first quartz-crystal resonator and the second quartz-crystal resonator are different in at least one of a film thickness of the electrode, an area of the electrode, and a thickness of the quartz-crystal piece. Alternatively, an order of the overtone oscillated by the first oscillator circuit and an order of the overtone oscillated by the second oscillator circuit are different from each other. Further, for example, the quartz-crystal piece of the first quartz-crystal resonator and the quartz-crystal piece of the second quartz-crystal resonator are common.

The present invention is the oscillation device correcting the output frequency based on the detection result of the environmental temperature, wherein, assuming that the oscillation outputs of the first and second oscillator circuits are f1 and f2, and the oscillation frequencies of the first and second oscillator circuits at the reference temperature are f1r and f2r respectively, the value corresponding to the difference value between the value corresponding to the difference between f1 and f1r and the value corresponding to the difference between f2 and f2r is handled as a temperature at a current moment, and as f1 and f2, the overtones of the respective quartz-crystal resonators are used. The overtones are stable against a temperature change because a capacitance ratio expressed by $C_0/C_1$ is large, and therefore the use of the two overtone oscillations whose temperature characteristics are different makes it possible to find an accurate value (temperature). Further, the value corresponding to the difference value exhibits very good correlation with temperature, and therefore, the highly accurate temperature compensation of the output frequency is enabled.

DETAILED DESCRIPTION OF THE PREFERRED EMBODIMENTS

Figure 1:
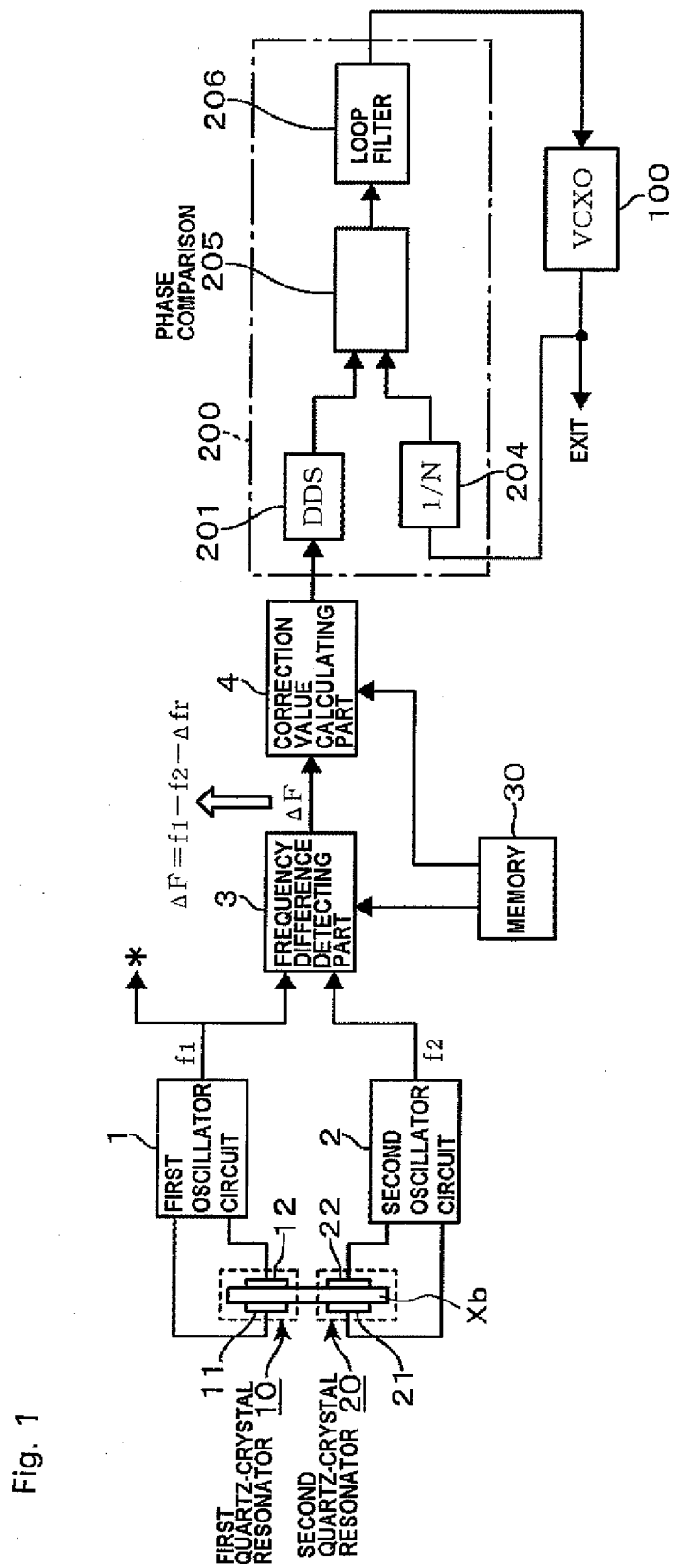
FIG. 1 is a block diagram showing the whole structure of an embodiment of the present invention.

FIG. 1 is a block diagram showing the whole structure of an embodiment of the oscillation device of the present invention. This oscillation device is a TCXO, is structured as a frequency synthesizer outputting a frequency signal with a set frequency, and includes: a voltage-controlled oscillator 100 using a quartz-crystal resonator; a control circuit part 200 forming a PLL in the voltage-controlled oscillator 100; and a temperature compensating part performing temperature compensation of a reference clock input to the control circuit part 200. The temperature compensating part, though not assigned a reference sign, corresponds to a part on the left of the control circuit part 200 in FIG. 1.

The control circuit part 200 forms a clock for reference based on a sawtooth wave output from a DDS (Direct Digital Synthesizer) circuit part 201. Then, its phase comparing part 205 compares a phase of an output signal which is an output of the voltage-controlled oscillator 100 frequency-divided of by a frequency divider 204 and a phase of the clock for reference, and based on a value resulting from integration of the comparison result by a loop filter 206, a control voltage of the voltage-controlled oscillator 100 is adjusted.

Here, the DDS circuit part 201 uses, as a reference clock, a frequency signal output from a later-described first oscillator circuit 1 and receives a control voltage based on which it outputs the sawtooth wave with a target frequency. However, since a frequency of the reference clock has a temperature characteristic, the control voltage input to the DDS circuit part 201 is added to a signal corresponding to a later-described frequency correction value in order to cancel the temperature characteristic. In FIG. 1, this structure is briefly depicted, and as a result of the correction of the control voltage input to the DDS circuit part 201, a temperature-dependent change amount of the output frequency of the DDS circuit part 201 ascribable to a temperature-dependent change amount of the reference clock is canceled, which as a result stabilizes the frequency of the clock for reference against the temperature change to stabilize the output frequency from the voltage-controlled oscillator 100.

The temperature compensating part includes a first quartz-crystal resonator 10 and a second quartz-crystal resonator 20, and these first quartz-crystal resonator 10 and second quartz-crystal resonator 20 use a common quartz-crystal piece Xb. Specifically, a region of the quartz-crystal piece Xb in, for example, a strip shape is divided into two in a length direction, and excitation electrodes are provided on both front and rear surfaces of each of the division regions (vibration regions). Therefore, one of the division regions and a pair of electrodes 11, 12 constitute the first quartz-crystal resonator 10, and the other division region and a pair of electrodes 21, 22 constitute the second quartz-crystal resonator 20. Therefore, it can be said that the first quartz-crystal resonator 10 and the second quartz-crystal resonator 20 are thermally coupled to each other.

The first oscillator circuit 1 and a second oscillator circuit 2 are connected to the first quartz-crystal resonator 10 and the second quartz-crystal resonator 20 respectively. Outputs (oscillation frequencies) of these oscillator circuits 1, 2 are, for example, third overtones (harmonics) of the quartz-crystal resonators 10, 20. The electrodes 11, 12 of the first quartz-crystal resonator 10 are different in thickness from the electrodes 21, 22 of the second quartz-crystal resonator 20, which results in deviation of the frequencies output from the first oscillator circuit 1 and the second oscillator circuit 2 from each other.

That "the frequencies deviate from each other" mentioned here more concretely means that absolute frequencies of the respective quartz-crystal resonators deviate from each other, so that, for example, f1 becomes 81.9 MHz and f2 becomes 76.69 MHz and that curves of temperature characteristics of the respective quartz-crystal resonators deviate in a rotating manner as shown in later-described FIG. 8. That the curves of the temperature characteristics rotate means the following. Temperature is standardized on a reference temperature (for example, 25° C.), and in accordance with a variation in film thickness, roughly a cubic curve rotates with respect to the frequency at the reference temperature, the cubic curve being data on a relation between a frequency change ratio (f−fr)/fr, which is equal to a difference (f−fr) between a frequency f at a certain temperature and a frequency fr at the reference temperature divided by fr, and the standardized temperature. Therefore, it can be said that a difference value between the both characteristics is highly sensitive to a temperature value. Incidentally, in order to deviate the output frequencies of the first oscillator circuit 1 and the second oscillator circuit 2 from each other, areas of the electrodes included in the respective quartz-crystal resonators 10, 20 may be made different or the quartz-crystal piece Xb included in the quartz-crystal resonators 10, 20 may be made different in thickness, instead of thus making the electrodes of the respective quartz-crystal resonators different in film thickness.

In order to obtain such overtone outputs, for example, an overtone tuning circuit, which is provided in an oscillation loop composed of a quartz-crystal resonator and an amplifier, may oscillate the oscillation loop with the overtone. Another alternative structure may be such that an oscillation loop is oscillated with a fundamental, a class C amplifier is provided on a subsequent stage of an oscillation stage, for example, on a subsequent stage of an amplifier being part of a Colpitts circuit to distort the fundamental, and a tuning circuit tuning to the overtone is provided on a subsequent stage of the class C amplifier, and as a result, oscillation frequencies being, for example, third overtones are output from both of the oscillator circuits 1, 2.

Here, assuming, for convenience sake, that a frequency signal with a frequency f1 is output from the first oscillator circuit 1 and a frequency signal with a frequency f2 is output from the second oscillator circuit 2, the frequency signal with the frequency f1 is supplied as the reference clock to the aforesaid control circuit part 200.

3 denotes a frequency difference detecting part, and roughly speaking, the frequency difference detecting part 3 is a circuit part for taking out $\Delta F=f2-f1-\Delta fr$ which is a difference between a difference between f1 and f2 and $\Delta fr$. $\Delta fr$ is a difference between f1 and f2 at the reference temperature, for example, 25° C. An example of the difference between f1 and f2 is several MHz. The present invention is realized by the frequency difference detecting part 3 calculating the aforesaid $\Delta F$, but in this embodiment, in more detail, the frequency difference detecting part 3 calculates OSC2−OSC1 [$=\{(f2-f2r)/f2r\}-\{(f1-f1r)/f1r\}$] which will be described later. However, at this stage, for easier understanding of the operation of the frequency difference detecting part 3 and the whole flow of the embodiment, a description will be given on assumption that the frequency difference detecting part 3 is a circuit taking out $\Delta F=f2-f1-\Delta fr$, and the indications are unified in this manner in the drawings.

Figure 2:
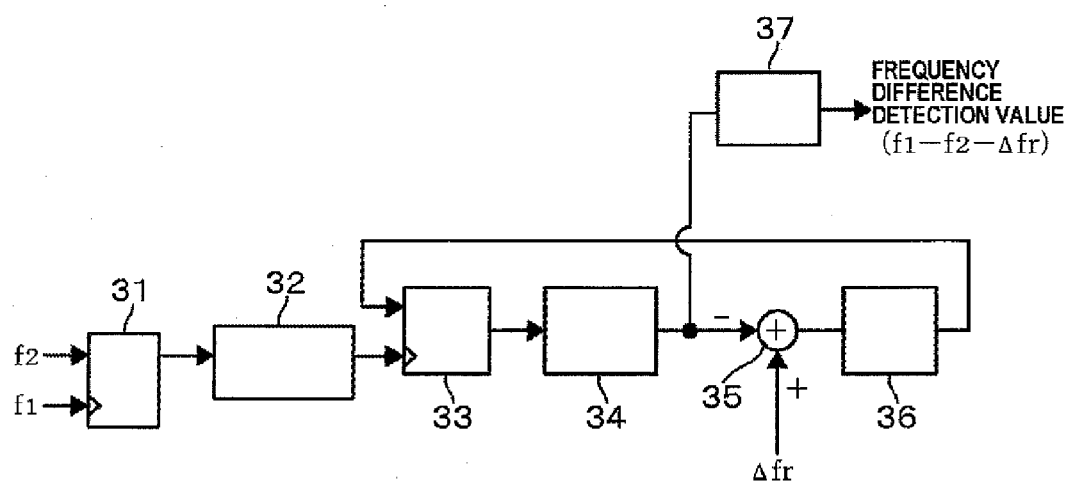
FIG. 2 is a block diagram showing part of the embodiment of the present invention.

FIG. 2 shows a concrete example of the frequency difference detecting part 3. 31 denotes a flip-flop circuit (F/F circuit). The frequency signal with the frequency f1 from the first oscillator circuit 1 is input to one input end of the flip-flop circuit 31, and the frequency signal with the frequency f2 from the second oscillator circuit 2 is input to the other input end, and the frequency signal with the frequency f2 from the second oscillator circuit 2 is latched, triggered by the frequency signal with the frequency f1 from the first oscillator circuit 1. Hereinafter, in order to avoid redundant description, f1 and f2 are handled as representing the frequencies or the frequency signals themselves. The flip-flop circuit 31 is structured to output a pulse signal with a 50% duty ratio having a frequency corresponding to a frequency difference between f1 and f2 (in this example, f2−f1).

Figure 3:
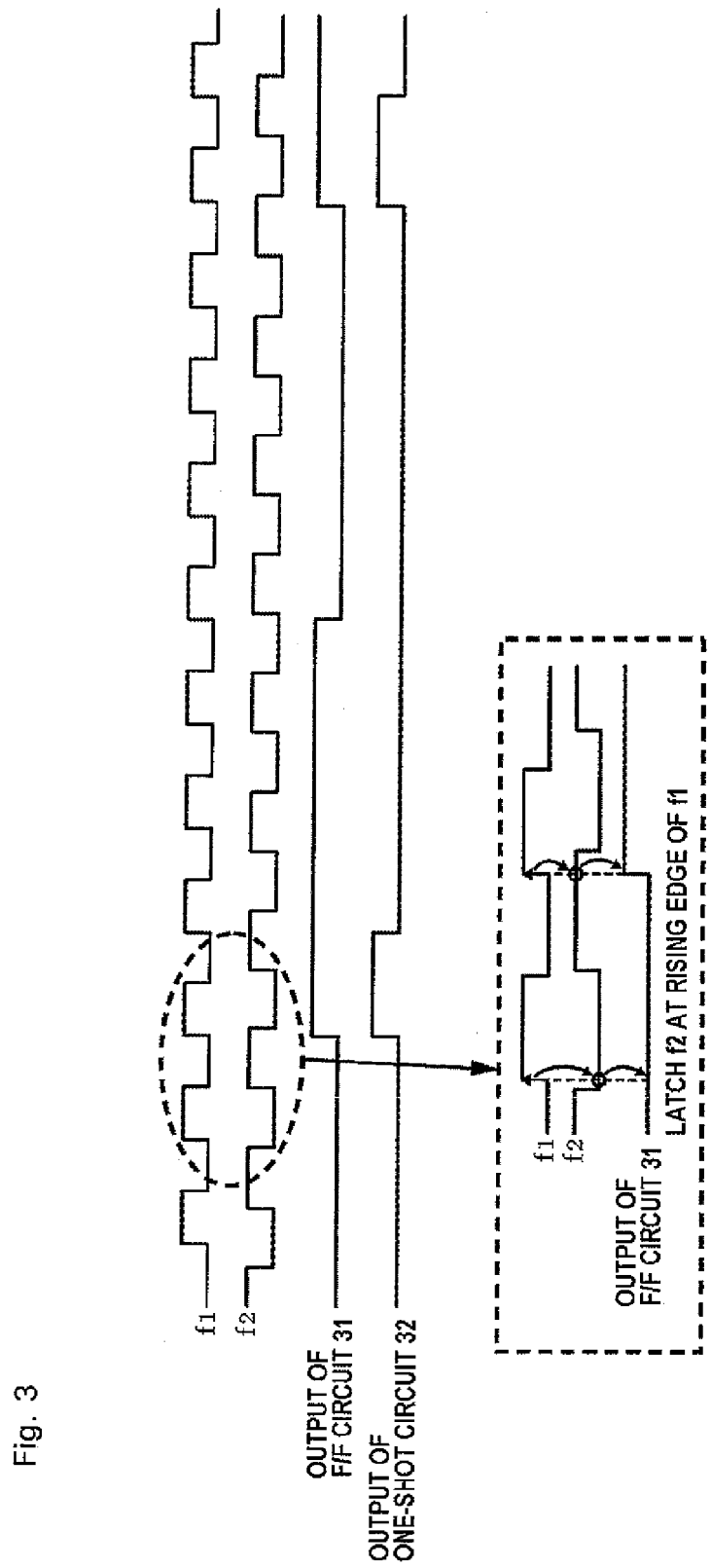
FIG. 3 is a waveform chart of outputs of the part shown in FIG. 2.

On a subsequent stage of the flip-flop circuit 31, a one-shot circuit 32 is provided, and the one-shot circuit 32 outputs a one-shot pulse at a rising edge of the pulse signal obtained from the flip-flop circuit 31. FIG. 3 are time charts showing a series of the signals described so far.

On a subsequent stage of the one-shot circuit 32, a PLL (Phase Locked Loop) is provided, and this PLL includes a latch circuit 33, a loop filter 34 having an integration function, an adding part 35, and a DDS circuit part 36. The latch circuit 33 is intended to latch the sawtooth wave output from the DDS circuit part 36, triggered by the pulse output from the one-short circuit 32, and an output of the latch circuit 33 has a signal level that the sawtooth wave has at a timing when the pulse is output. The loop filter 34 integrates a DC voltage being this signal level and the adding part 35 adds this DC voltage and a DC voltage corresponding to Δfr. Data corresponding to the DC voltage corresponding to Δfr is stored in a memory 30 shown in FIG. 1.

Figure 4:
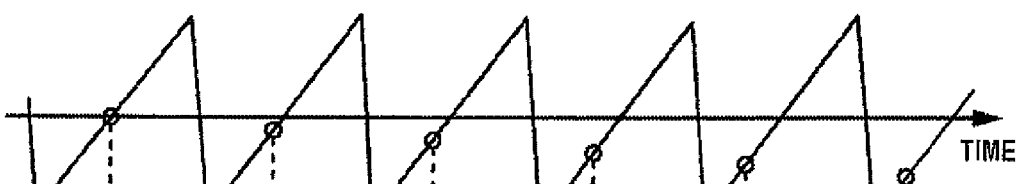
FIG. 4(a) to FIG. 4(c) are waveform charts of respective parts, schematically showing an unlocked state in a loop including a DDS circuit part shown in FIG. 2.
Figure 4:
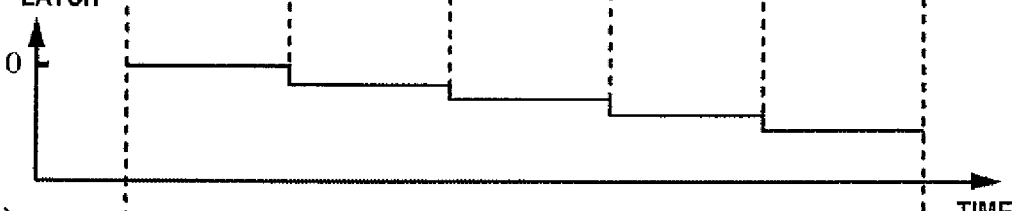
Figure 4:
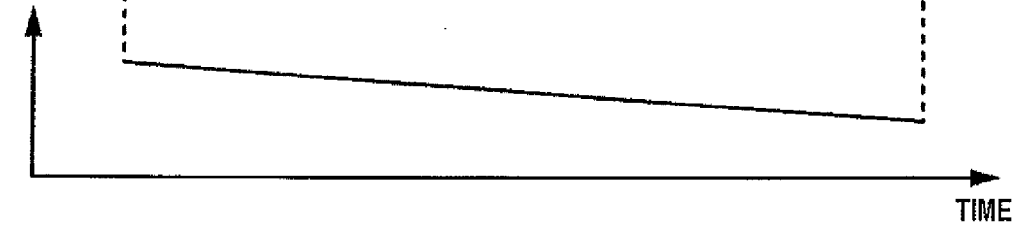

In this example, in the adding part 35, a sign of an input side of the DC voltage corresponding to Δfr is "+" and a sign of an input side of an output voltage of the loop filter 34 is "−". To the DDS circuit part 36, a DC voltage calculated in the adding part 35 is input, that is, a voltage equal to the DC voltage corresponding to Δfr from which the output voltage of the loop filter 34 is subtracted is input, and the sawtooth wave with a frequency corresponding to this voltage value is output therefrom. For easier understanding of the operation of the PLL, states of the outputs of the respective parts are considerably schematically shown in FIG. 4. At the startup time of the device, the DC voltage corresponding to Δfr is input to the DDS circuit part 36 via the adding part 35, and assuming that Δfr is 5 MHz, for instance, the sawtooth wave with the frequency corresponding to this frequency is output from the DDS circuit part 36.

Figure 5:
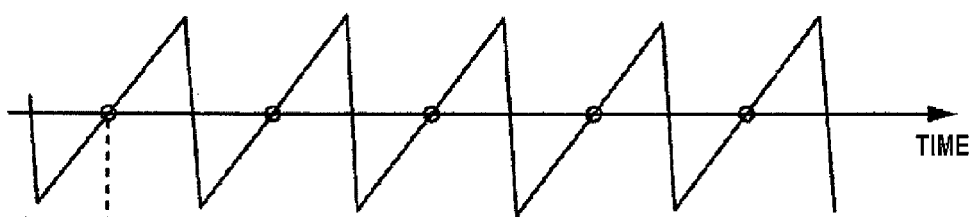
FIG. 5(a) to FIG. 5(c) are waveform charts of the respective parts, schematically showing a locked state in the loop including the DDS circuit part shown in FIG. 2.
Figure 5:
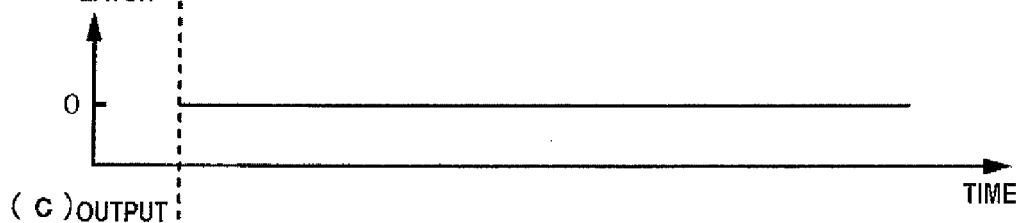
Figure 5:
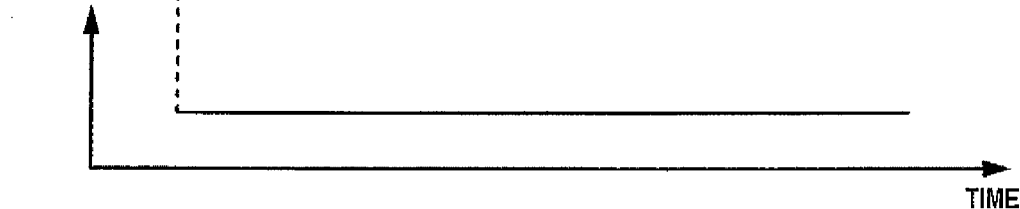

The sawtooth is latched by the latch circuit 33, triggered by the pulse with the frequency corresponding to (f2−f1), and assuming that (f2−f1) is 6 MHz, for instance, since a period of the latch pulse is shorter than that of the sawtooth wave, a latch point of the sawtooth wave gradually becomes lower as shown in FIG. 4(a), and the output of the latch circuit 33 and the output of the loop filter 34 gradually become lower to one side as shown in FIG. 4(b) and FIG. 4(c). Since the sign of the output side of the loop filter 34 in the adding part 35 is "−", the DC voltage input from the adding part 35 to the DDS circuit part 36 increases. Consequently, the frequency of the sawtooth wave output from the DDS circuit part 36 becomes higher, and when the DC voltage corresponding to 6 MHz is input to the DDS circuit part 36, the frequency of the sawtooth wave becomes 6 MHz and the PLL is locked as shown in FIG. 5(a) to FIG. 5(c). The DC voltage output from the loop filter 34 at this time has a value corresponding to Δfr−(f2−f1)=−1 MHz. That is, it can be said that an integration value of the loop filter 34 corresponds to an integration value of a 1 MHz change when the sawtooth wave changes from 5 MHz to 6 MHz.

Figure 6:
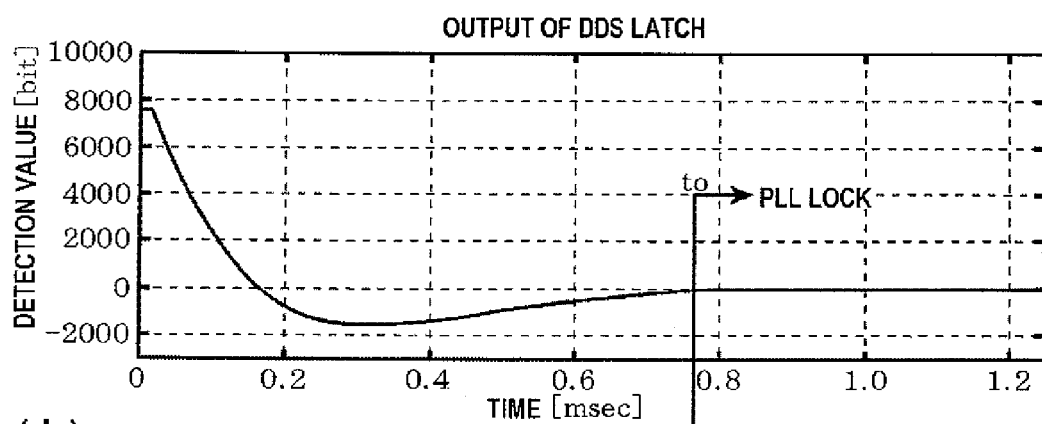
FIG. 6(a) and FIG. 6(b) are waveform charts of the respective parts in the loop, in an actual device corresponding to the embodiment.
Figure 6:
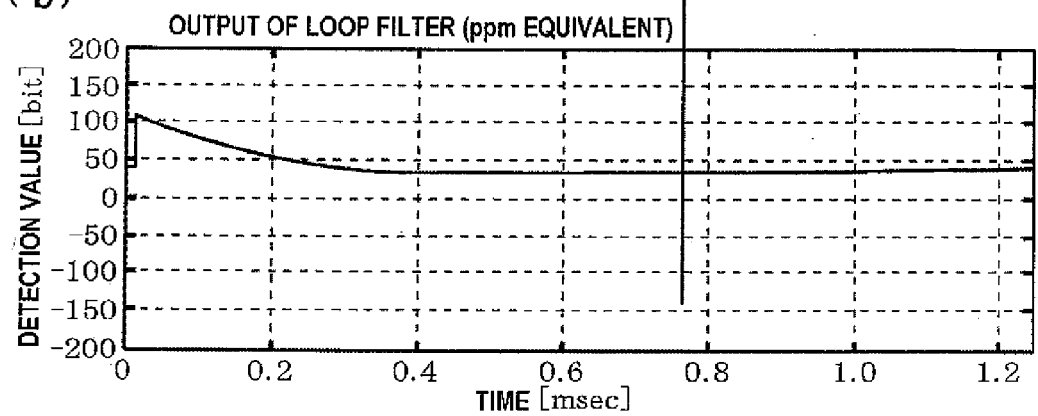

Contrary to this example, when Δfr is 6 MHz and (f2−f1) is 5 MHz, since the period of the latch pulse is longer than that of the sawtooth wave, the latch point shown in FIG. 4(a) gradually becomes higher, and accordingly, the output of the latch circuit 33 and the output of the loop filter 34 also increase. Consequently, since the subtrahend value in the adding part 35 becomes large, the frequency of the sawtooth wave gradually becomes lower, and when it becomes 5 MHz equal to (f2−f1) in due course, the PLL is locked. The DC voltage output from the loop filter 34 at this time has a value corresponding to Δfr−(f2−f1)=1 MHz. Incidentally, output values of the latch circuit 33 and the loop filter 34 incorporated in an actual circuit when the frequency difference (f2−f1) between f1 and f2 is 40 ppm are shown in FIG. 6(a) and FIG. 6(b). In this example, the PLL is locked at a time t0.

Further, since the operation of latching C, triggered by f1 in the flip-flop circuit 31 is asynchronous, there is a possibility that an unstable period such as a metastable state occurs (when input data is latched at an edge of a clock, it is necessary to retain the input data for a certain time before and after the edge for latching, and the metastable state is a state where the output becomes unstable due to a substantially synchronous change of the clock and the input data), which involves a possibility that the output of the loop filter 34 includes an instantaneous error. In the above-described PLL, the output of the loop filter 34 is handled as the difference between Δfr and (f2−f1), which is a value corresponding to temperature, and therefore, an averaging circuit 37 finding a moving average of an input value at a preset time is provided on the output side of the loop filter 34, thereby removing the instantaneous error even if it occurs. Providing the averaging circuit 37 makes it possible to finally obtain frequency deviation information corresponding to a temperature variation with high accuracy.

Figure 7:
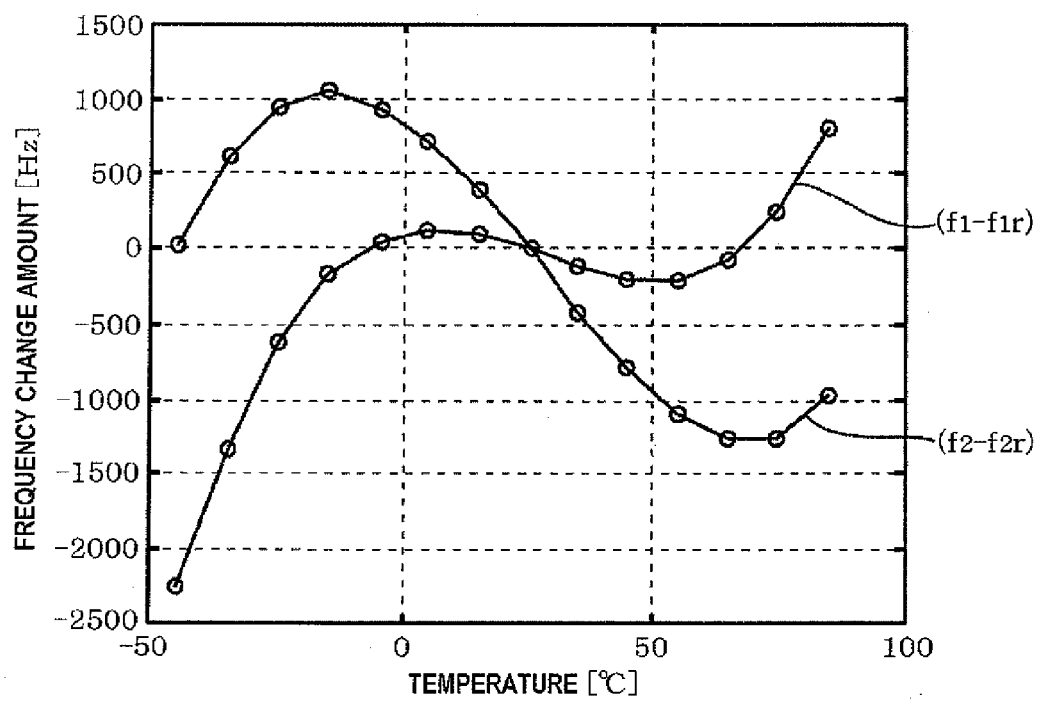
FIG. 7 is a frequency-temperature characteristic chart showing relations of a frequency f1 of a first oscillator circuit and a frequency f2 of a second oscillator circuit with temperature.

The frequency deviation information corresponding to the temperature variation obtained in the loop filter 34 of the PLL, in this example, Δfr−(f2−f1), is input to the correction value calculating part 4 shown in FIG. 1, which is a correction value obtaining part, and there the correction value of the frequency is calculated. Before the correction value calculating part 4 is described, the frequency deviation information and the frequency correction value will be described with reference to FIG. 7 to FIG. 10. FIG. 7 is a characteristic chart showing a relation between temperature and frequency, with f1 and f2 being normalized on the reference temperature. The normalization mentioned here means that, for example, 25° C. is defined as the reference temperature, the frequency at the reference temperature is defined as zero in the relation between temperature and frequency, and a relation between a frequency deviation amount from the frequency at the reference temperature and temperature is found. Assuming that the frequency at 25° C. in the first oscillator circuit 1 is f1$r$ and the frequency at 25° C. in the second oscillator circuit 2 is f2$r$, that is, assuming that values of f1 and f2 at 25° C. are f1$r$ and f2$r$ respectively, the values on the vertical axis in FIG. 7 are (f1−f1$r$) and (f2−f2$r$).

Figure 8:
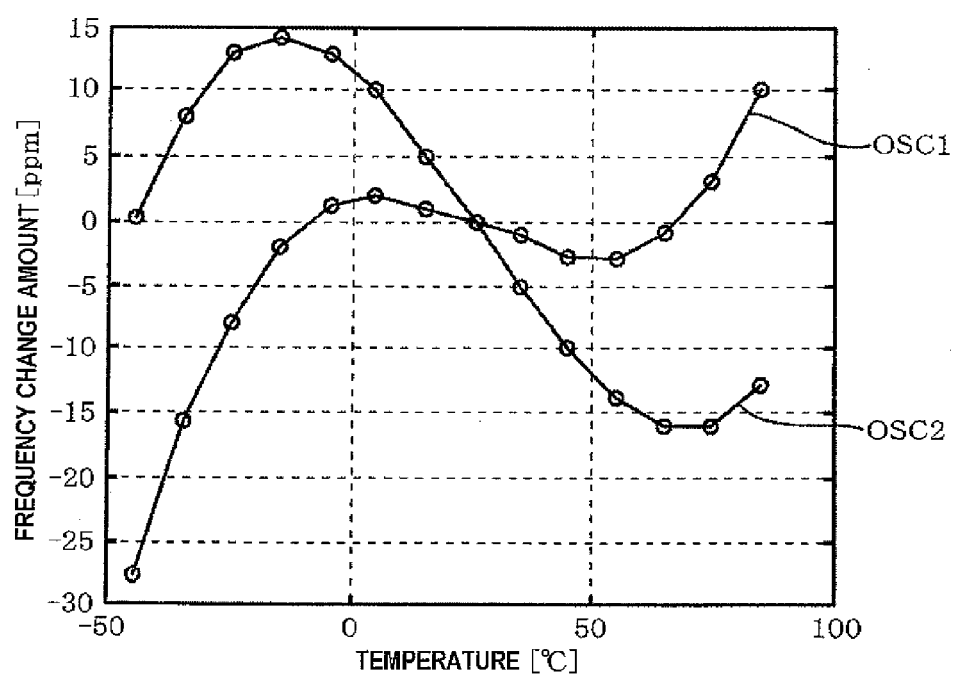
FIG. 8 is a frequency-temperature characteristic chart showing relations between normalized values of f1 and f2 and temperature.

Further, FIG. 8 shows change ratios of the frequencies at each temperature shown in FIG. 7 to the frequencies at the reference temperature (25° C.). Therefore, the values on the vertical axis in FIG. 8 are (f1−f1$r$)/f1$r$ and (f2−f2$r$)/f2$r$, and these values will be represented by OSC1 and OSC2 respectively. Note that a unit of the values on the vertical axis in FIG. 8 is ppm.

Here, returning to the description of the frequency difference detecting part 3, the frequency difference detecting part 3 in this embodiment calculates to find not the value itself of (f2−f2$r$)−(f1−f1$r$)=f2−f1−Δfr but find OSC2−OSC1 as previously described. This means that regarding a value of a ratio showing at which ratio each of the frequencies deviates from the frequency at the reference temperature, a difference between the ratio in f2 and the ratio in f1 is found. The frequency signal corresponding to (f2−f1) is input to the latch circuit 33, but since the sawtooth wave is input into the PLL loop, the circuit can be configured so as to perform such calculation. Assuming that the output of the frequency difference detecting part 3 is a 34-bit digital value, a 0.058 (ppb) value, for instance, is assigned per bit, and therefore, the value of OSC2−OCS1 can be obtained with accuracy up to 0.058 (ppb). Expressions (2) to (4) to be described later are grounds supporting the fact that the 0.058 (ppb) value can be set per bit. Let us explain FIG. 6(a) and FIG. 6(b) at this stage. FIG. 6(a) and FIG. 6(b) show output values of the latch circuit 33 and the loop filter 34 incorporated in the actual circuit when the frequency difference (to be precise, the difference in frequency change ratio) OSC2−OCS1 between f1 and f2 is 40 ppm.

Figure 9:
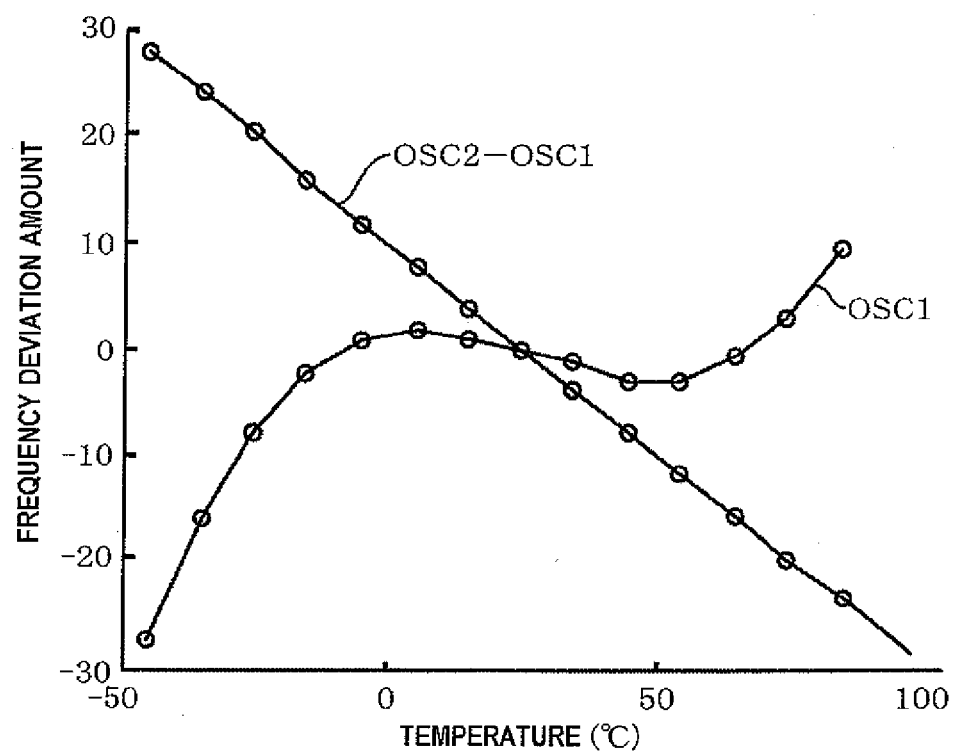
FIG. 9 is a frequency-temperature characteristic chart showing a relation between the normalized value of f1 and temperature, and a relation of a difference ΔF between the normalized value of f1 and the normalized value of f2 with temperature.

FIG. 9 shows a relation between OSC1 and temperature (same as FIG. 8) and a relation between (OSC2−OSC1) and temperature, from which it is seen that (OSC2−OSC1) and temperature are in a linear relation. Therefore, it is seen that (OSC2−OSC1) corresponds to a temperature variation from the reference temperature. It is generally said that a frequency-temperature characteristic of a quartz-crystal resonator is expressed by a cubic function, and therefore, by finding in advance a relation between a frequency correction value canceling the frequency change amount in this cubic function and (OSC2−OSC1), it is possible to find the frequency correction value based on a detection value of (OSC2−OSC1).

Figure 10:
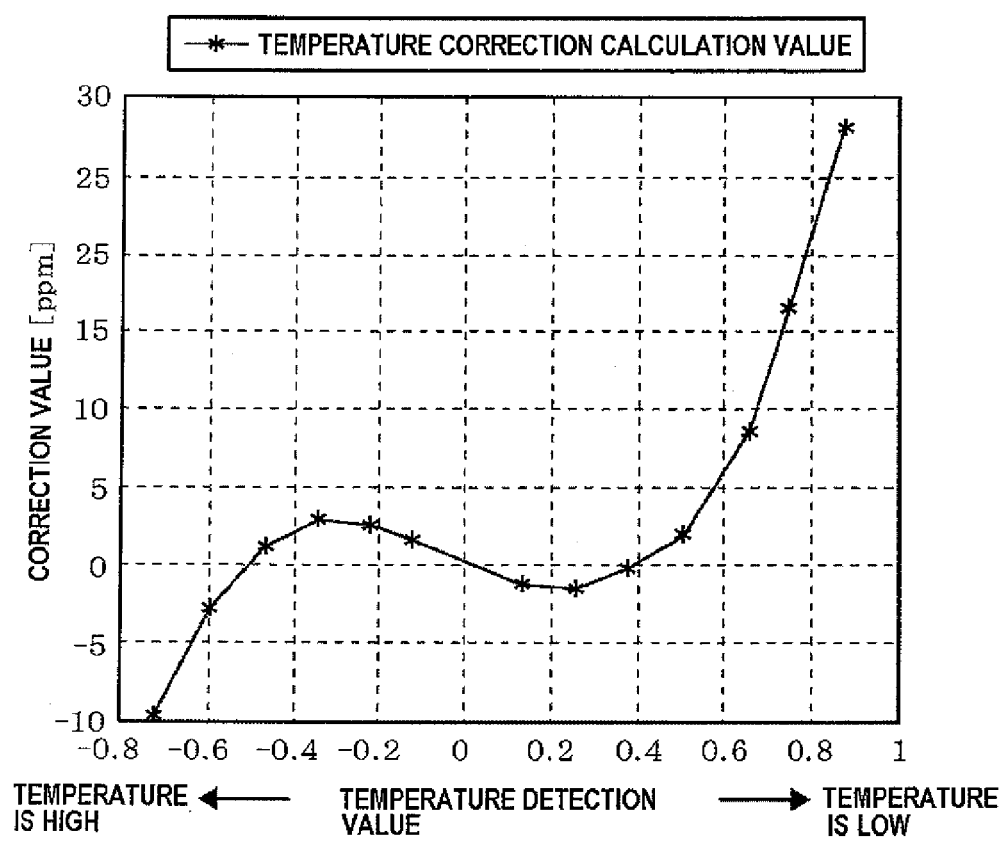
FIG. 10 is a characteristic chart showing a relation between the normalized value of the vertical axis in FIG. 9 and a frequency correction value.

The oscillation device of this embodiment uses the frequency signal (f1) obtained from the first oscillator circuit 1, as the reference clock of the control circuit part 200 shown in FIG. 1 as previously described, and since this reference clock has a frequency-temperature characteristic, it is intended to make temperature correction of the frequency of the reference clock. For this purpose, a function showing the relation between temperature and f1 normalized on the reference temperature is first found in advance, and a function for canceling the frequency change amount of f1 in the first found function is found as shown in FIG. 10. Therefore, the vertical axis in FIG. 10 represents −OSC1. In this example, for the purpose of the high-accuracy temperature correction, the above function is decided as a nonic function, for instance.

Since temperature and (OSC2−OSC1) are in the linear relation as previously described, the horizontal axis in FIG. 10 represents a value of (OSC2−OSC1), but if the value of (OSC2−OSC1) is used as it is, a data volume for specifying this value becomes large, and therefore, the value of (OSC2−OSC1) is normalized in the following manner. Specifically, an upper limit temperature and a lower limit temperature under which the oscillation device is expected to be actually used are decided in advance, and a value of (OSC2−OSC1) at the upper limit temperature is handled as +1 and a value of (OSC2−OSC1) at the lower limit temperature is handled as −1. In this example, −30 ppm is defined as +1 and +30 ppm is defined as −1 as shown in FIG. 10.

In this example, the temperature-dependent frequency characteristic in the quartz-crystal resonator is handled as a nonic polynomial approximate expression. Concretely, during the production of the quartz-crystal resonator, the relation between (OSC2−OSC1) and temperature is obtained by actual measurement, and from this actually measured data, a correction frequency curve showing the relation between temperature and −OSC1, that cancels the temperature-dependent frequency change amount is derived, and coefficients of the nonic polynomial approximate expression are derived by a least squares method. Then, the coefficients of the polynomial approximate expression are stored in the memory 30 (refer to FIG. 1) in advance, and the correction value calculating part 4 calculates an expression (1) by using these coefficients of the polynomial approximate expression.

$$Y = P1 \cdot X^9 + P2 \cdot X^8 + P3 \cdot X^7 + P4 \cdot X^6 + P5 \cdot X^5 + P6 \cdot X^4 + P7 \cdot X^3 + P8 \cdot X^2 + P9 \cdot X \quad (1)$$

In the expression (1), X is the frequency difference detection information, Y is the correction data, and P1 to P9 are the coefficients of the polynomial approximate expression.

Figure 11:
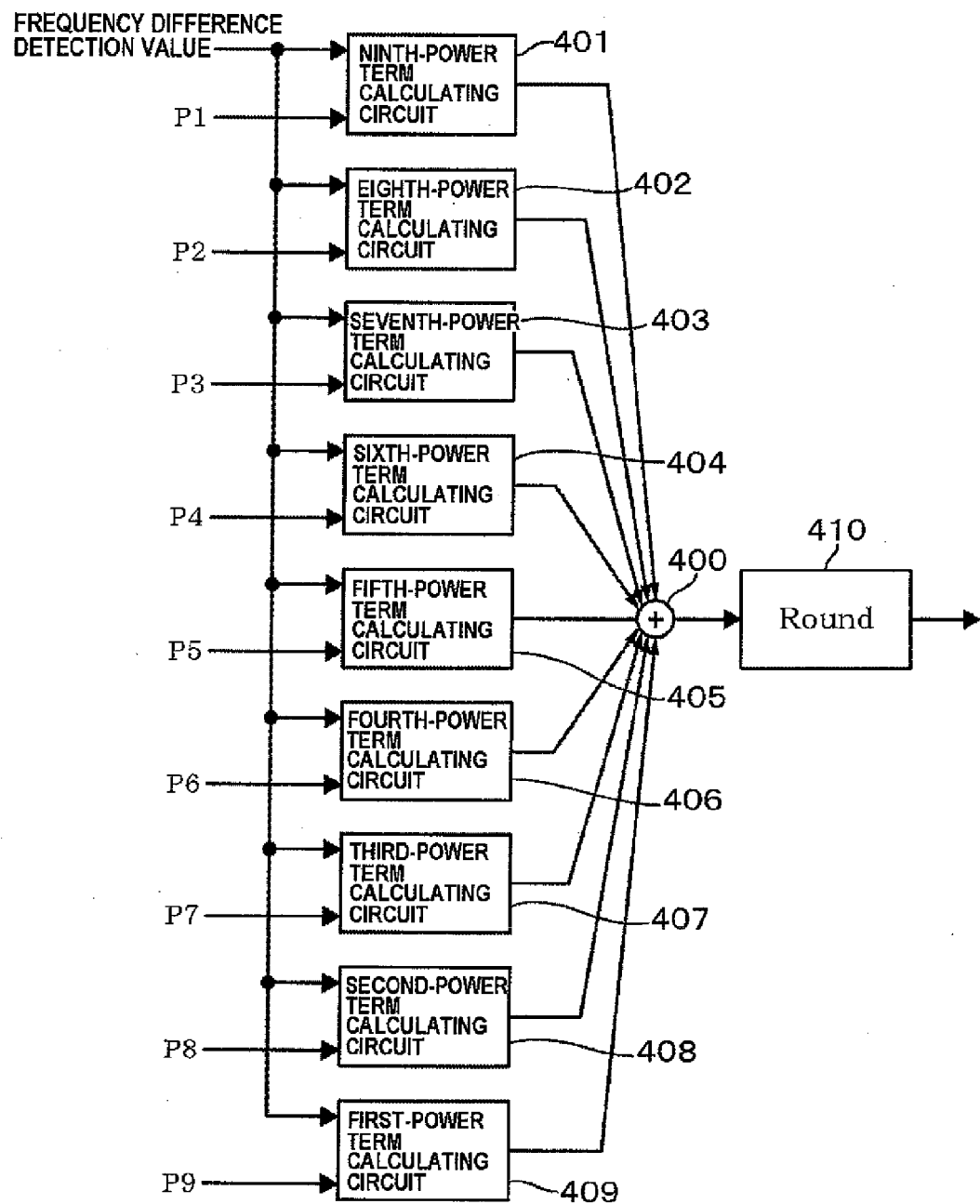
FIG. 11 is a block diagram showing a correction value calculating part.

Here, X is a value obtained by the frequency difference detecting part 3 shown in FIG. 1, that is, the value (OSC2−OSC1) obtained by the averaging circuit 37 shown in FIG. 2. An example of a block diagram for executing the calculation in the correction value calculating part 4 is shown in FIG. 11. In FIGS. 11, 401 to 409 denote calculating parts calculating the respective terms of the expression (1), 400 denotes an adding part, and 410 denotes a circuit for rounding. Incidentally, the correction value calculating part 4 may be structured, for example, to use one multiplying part for all the multiplications in such a manner that the multiplying part finds a value of the ninth power term, next the multiplying part finds a value of the eighth power term, and so on, and finally the values of the respective power terms are added. The arithmetic expression of the correction value is not limited to the nonic polynomial approximate expression, and an approximate expression of a degree appropriate for required accuracy may be used.

Next, the whole operation of the above-described embodiment will be summarized. The frequency signal output from the first oscillator circuit 1 is supplied as the clock signal to the control circuit part 200 of the voltage-controlled oscillator 100, and as described at the beginning of this embodiment, the frequency signal with the target frequency is output from the voltage-controlled oscillator 100 under the control operation in the control circuit part 200. Meanwhile, the frequency signals f1, f2 output from the first oscillator circuit 1 and the second oscillator circuit 2 respectively are input to the frequency difference detecting part 3 and the PLL is locked by the operation already detailed, in this example, when the output of the PLL being the output of the frequency difference detecting part 3 becomes a value corresponding to {Δfr−(f2−f1)}. Then, this value is input to the correction value calculating part 4, where the expression (1) is calculated, so that the frequency correction amount being the temperature correction data is obtained. The calculation of the expression (1) is a process of finding the value of the vertical axis of the correction frequency curve in the characteristic chart shown in, for example, FIG. 10, this value being corresponding to the value obtained based on the output value of the frequency difference detecting part 3.

As shown in FIG. 1, the first quartz-crystal resonator 10 and the second quartz-crystal resonator 20 use the common quartz-crystal piece Xb and are thermally coupled to each other, and therefore, the frequency difference between the oscillator circuits 11, 12 is a value highly accurately corresponding to the environmental temperature, and therefore, the output of the frequency difference detecting part 3 is temperature difference information between the environmental temperature and the reference temperature (in this example, 25° C.). Since the frequency signal f1 output from the first oscillator circuit 11 is used as a main clock of the control circuit part 200, the correction value obtained in the correction value calculating part 4 is used as a signal for compensating the operation of the control circuit part 200 in order to cancel the influence that the frequency deviation amount of f1 ascribable to the temperature deviation from 25° C. has on the operation of the control circuit part 200. As a result, the output frequency of the voltage-controlled oscillator 100 being the output of the oscillation device of this embodiment becomes stable irrespective of a temperature change.

As described above, according to the above-described embodiment, it is possible to obtain the accurate frequency deviation information corresponding to the temperature variation, even though the operation clock itself changes depending on the temperature, and as a result, it is possible to realize a highly stable and highly accurate oscillation device. Further, the frequency difference detection information (the frequency deviation information corresponding to the temperature variation) is the difference value between the value corresponding to the difference between f1 and f1r and the value corresponding to the value between f2 and f2r. Therefore, a complicated work of the adjustment to f1≈f2 as required in Patent Document 1 is not necessary and there is no problem of a decrease in yield of the quartz-crystal resonator. Further, as f1 and f2, the overtones of the respective quartz-crystal resonators are used. The overtone undergoes a larger temperature-dependent frequency change than a fundamental, and the value corresponding to the difference value exhibits very good correlation with temperature, and therefore, it is possible to make the temperature compensation of the output frequency highly accurately.

In order to find the frequency difference detection information, the pulse with the difference frequency between f1 and f2 is generated, the sawtooth signal output from the DDS circuit part 36 is latched by the latch circuit 33, triggered by the pulse, the latched signal value is integrated and the integration value is output as the frequency difference, and the difference between this output and the value corresponding to the difference between f1r and f2r is taken out to be input to the DDS circuit part 36, whereby the PLL is configured. When f1 and f2 are counted and their difference is obtained as in Patent Document 1, the count time has a direct influence on detection accuracy, but this structure has no such a problem and therefore its detection accuracy is high. When the both methods were actually compared through simulation, with the count time in the frequency counting method being set to 200 ms, the obtained result showed that the method of this embodiment has detection accuracy about fifty times as high as that of the frequency counting method.

Further, the PLL of this embodiment has an advantage that its memory capacity can be decreased because it does not have a sine wave ROM table that a conventional DDS circuit part has, which can reduce the scale of the device. Further, since the frequency correction value is found by the calculation based on the frequency deviation information corresponding to the temperature variation, a large-capacity memory is not necessary, and from this viewpoint, it is possible to reduce the scale of the device and reduce cost.

The control circuit part 200 including the DDS circuit part 201 and forming the PLL thus controls the voltage-controlled oscillator 100 based on the correction value obtained in the correction value calculating part 4, but a dynamic range of this PLL needs to be capable of tolerating deviation of the voltage-controlled oscillator 100 including the temperature characteristic of the voltage-controlled oscillator 100.

Further, in the above-described oscillation device, for example, the voltage-controlled oscillator 100 includes the quartz-crystal resonator and the frequency divider 204 is formed as a variable frequency divider. With this structure, it is possible to manufacture an oscillation device outputting an arbitrary frequency, only by changing a frequency division number of the frequency divider 204 and the quartz-crystal resonator forming the voltage-controlled oscillator 100, without changing the circuit configurations of the temperature compensating part and the control circuit part 200. This has an advantage that an oscillation device adaptable to each output frequency can be easily manufactured.

Since the first quartz-crystal resonator 10 and the second quartz-crystal resonator 20 use the single quartz-crystal piece Xb and thus are placed in the same environment, it is as a result possible to highly accurately calculate $\Delta f-(f2-f1)$ being the frequency difference detection information. Further, in this embodiment, the oscillation device can be configured so that the frequency difference detecting part 3, the correction value calculating part 4, the DDS circuit part 201, and the frequency divider 204, the phase comparing circuit 205, and the loop filter 206 which are included in the control circuit part 200 are controlled by digital signals. With this configuration, it is possible to more accurately control the oscillation device. When these circuits are thus controlled by the digital signals, the above-described oscillation device is also excellent in phase noise characteristic because VCXO control by the PLL is executed. Further, the above-described oscillation device can realize frequency accuracy comparable to that of OCXO, for instance, but has an advantage of smaller power consumption than that of OCXO because it does not require an oven.

Further, this embodiment has an advantage of easy production because, in order to detect the frequency difference between the first quartz-crystal resonator 10 and the second quartz-crystal resonator 20, there is no need to strictly equalize the oscillation frequencies of the quartz-crystal resonators 10, 20, and there is no need to use the thermostatic oven in the production line to perform strict temperature control before the frequency measurement, which is described in DESCRIPTION OF THE RELATED ART. Further, as the quartz-crystal resonator forming the voltage-controlled oscillator 100, an ordinary one without being specially processed can be used, for example, which has an advantage that production load is not increased.

Figure 12:
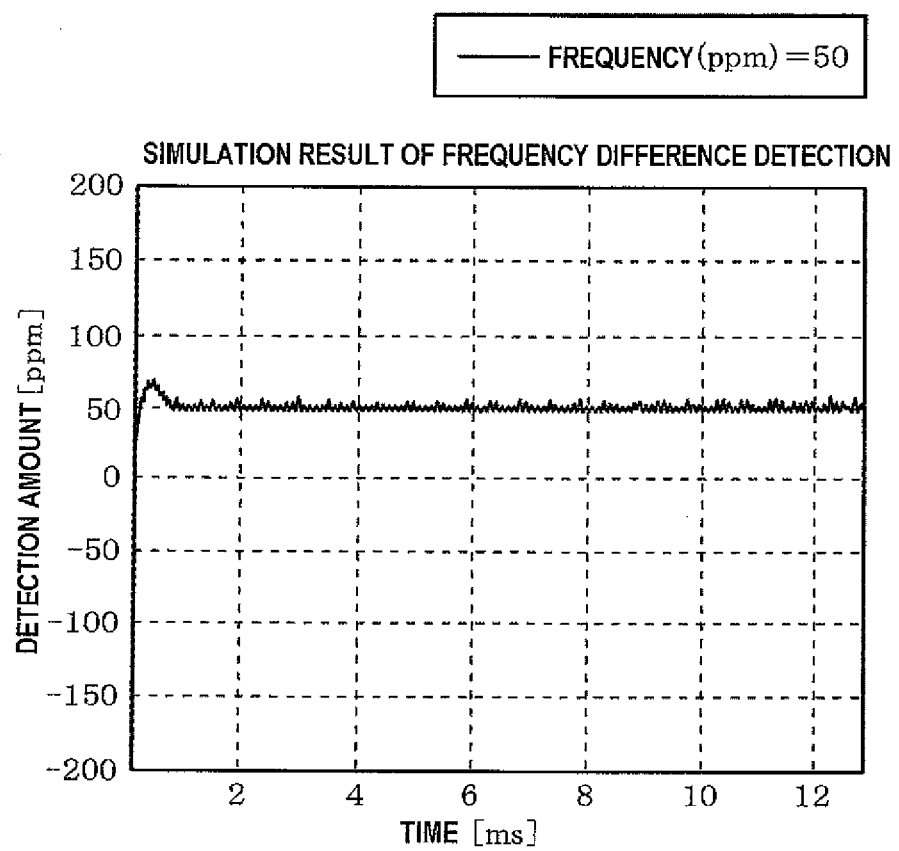
FIG. 12 is a characteristic chart showing an operation simulation of a frequency difference detecting part.

Here, FIG. 12 shows the result obtained when a relation between the frequency difference information, which is the output of the frequency difference detecting part 3, and time was studied by using the circuit in FIG. 2. Here, the first quartz-crystal resonator 10 and the second quartz-crystal resonator 20 are structured so that their electrodes are different in film thickness, and the frequency of the fundamental of the first quartz-crystal resonator 10 is set to 27.3 MHz and the frequency of the fundamental of the second quartz-crystal resonator 20 is set to 25.56 MHz. Then, three-time overtones of the fundamentals are output from the first oscillator circuit 1 and the second oscillator circuit 2, and f1 is 81.9 MHz and f2 is 76.69 MHz. Further, in this case, the frequency difference information is set to (OSC2−OSC1), and this value is +50 ppm.

Though the following is repeated explanation, the value corresponding to the difference between f1 and f1r in this embodiment is $\{(f1-f1r)/f1r\}$ (=OSC1), the value corresponding to the difference between f2 and f2r is $\{(f2-f2r)/f2r\}$ (=OSC2), and the value corresponding to the difference value between the value corresponding to the difference between f1 and f1r and the value corresponding to the difference between f2 and f2r is OSC2−OSC1. However, the frequency difference detecting part 3 may use the difference value itself between (f1−f1r) and (f2−f2r), as the value corresponding to the difference value between the value corresponding to the difference between f1 and f1r and the value corresponding to the difference between f2 and f2r. In this case, the graph in FIG. 7 is utilized to find the temperature.

In the above-described embodiment, in the description from FIG. 8 to FIG. 10, the frequency change amount is indicated in a unit of "ppm", but in an actual digital circuit, since all are handled in a binary number, frequency setting accuracy of the DDS circuit 36 is calculated in terms of the number of constituent bits, and is for example, 34 bits. For example, in a case where a 10 MHz clock is supplied to the DDS circuit part 201 included in the control circuit part 200 shown in FIG. 1 and a fluctuation frequency of this clock is 100 Hz, the following values are obtained.

[Calculation of Change Ratio]

100 Hz/10 MHz=0.00001

[ppm Equivalent]

0.00001*1e6=10 [ppm]

[DDS Setting Accuracy Equivalent]

$0.00001 * 2^{34} \approx 171{,}799$ [ratio−34 bit (tentative value)]

In the above-described structure, the frequency setting accuracy is expressed by the following expression (2).

$1\times[\text{ratio}-34\text{ bit}]=10\text{ M[Hz]}/2^{34}\approx 0.58\text{ m [Hz/bit]}$ (2)

Therefore, $$100 \text{ [Hz]}/0.58 \text{ m [Hz/bit]} \approx 171{,}799 \text{ [bit(ratio–34 bit)]}.$$

Further, 0.58 mHz to 10 MHz can be calculated as in the following expression (3).

$$0.58 \text{ m[Hz]}/10 \text{ M[Hz]} * 1e9 \approx 0.058 \text{ [ppb]} \quad (3)$$

Therefore, from the expressions (2), (3), the relation of an expression (4) holds true.

$$1e9/2^{\wedge}34 = 0.058 \text{ [ppb/ratio–34 bit]} \quad (4)$$

That is, the frequency processed by the DDS circuit 36 disappears and the relation only with the bit number remains.

Furthermore, in the above-described example, the first quartz-crystal resonator 10 and the second quartz-crystal resonator 20 use the common quartz-crystal piece Xb, but the quartz-crystal piece Xb need not be common. In this case, a possible example is to dispose the first quartz-crystal resonator 10 and the second quartz-crystal resonator 20 in a common casing. This structure provides the same effect because they are placed under substantially the same temperature environment. When separate quartz-crystal pieces are thus used, it is possible to deviate f1 and f2 from each other by differently chamfering the quartz-crystal pieces instead of making the quartz-crystal resonators different in thickness of the electrode film, an area of the electrode film, or a thickness of the quartz-crystal piece.

Further, in the above-described example, f1 and f2 are the third overtones of the quartz-crystal resonators 10, 20 respectively, but f1 and f2 may be overtones of different orders. For example, f1 may be a third overtone of the quartz-crystal resonator 10 and f2 may be a fifth overtone of the quartz-crystal resonator 20.

The output signal of the DDS circuit part 36 of the frequency difference detecting part 3 is not limited to the sawtooth wave, and may be any frequency signal, provided that its signal value repeatedly increases and decreases with time, and may be, for example, a sine wave.

Further, the frequency difference detecting part 3 may be structured to count f1 and f2 by a counter, subtract a value corresponding to Δfr from a difference value between the count values, and output a value corresponding to the obtained count value.

Figure 13:
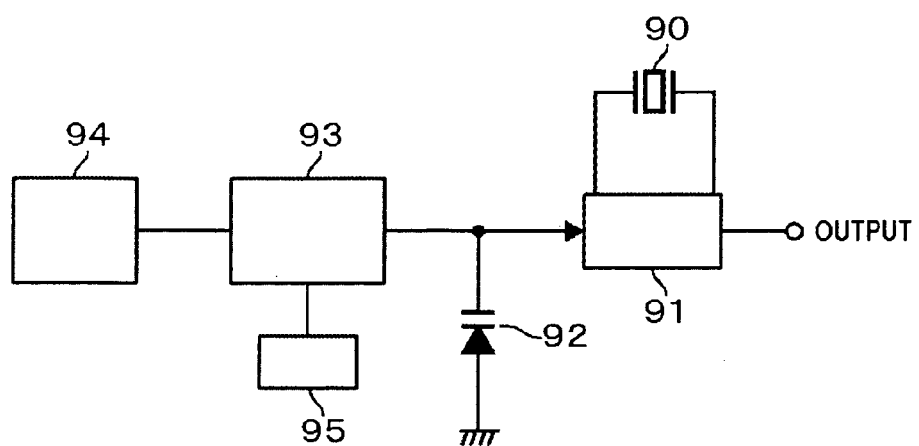
FIG. 13 is a block diagram showing a conventional TCXO.

The way the correction value found by the correction value calculating part 4 is used is not limited to that in the above-described embodiment. A different method may be used for the correction, provided that, when the output frequency of the oscillation device changes according to temperature, the compensation can be made so that a change amount of the output frequency can be canceled by using the correction value. For example, another possible structure may be the TCXO shown in FIG. 13 in which the frequency difference information obtained in the frequency difference detecting part 3 is used instead of the output of the temperature detector 94, a compensation amount of the control voltage corresponding to the frequency correction amount is found based on this information, the compensation amount and the reference voltage for causing the outputting of the frequency at the reference temperature are added in the control voltage generating part 93, and the resultant is used as the control voltage. A method of finding the frequency correction amount from the frequency difference information is not limited to the polynomial approximate expression in the above-described embodiment, but usable is a method in which a table showing a relation between the frequency difference information and the frequency correction amount is stored in a memory in advance and this table is referred to.

In the above-described embodiment, the frequency difference between the first quartz-crystal resonator 10 and the second quartz-crystal resonator 20 is used as, so to speak, a temperature measurement value, and based on this temperature measurement value, the frequency correction value of the first quartz-crystal resonator 10, corresponding to the temperature change is found. However, in the present invention, a structure in which the quartz-crystal resonator being a target of the frequency correction and one of two quartz-crystal resonators forming, so to speak, a thermometer are not made common is also included in the technical scope of the claims.

It can be said that the correction value obtaining part in this case obtains a frequency correction value of an oscillation frequency M of another oscillator circuit oscillating another quartz-crystal resonator different from the first quartz-crystal resonator and the second quartz-crystal resonator, based on the value corresponding to the aforesaid difference value detected by the frequency difference detecting part and based on a relation between the value corresponding to the difference value and the frequency correction value of the oscillation frequency f0, instead of obtaining the frequency correction value of f1 based on the value corresponding to the difference value detected by the frequency difference detecting part and based on the relation between the value corresponding to the difference value and the frequency correction value of the oscillation frequency f1 of the first oscillator circuit.

What is claimed is:

1. An oscillation device correcting an output frequency based on a detection result of an environmental temperature, the oscillation device comprising:
   a first quartz-crystal resonator including a first electrode provided on a quartz-crystal piece;
   a second quartz-crystal resonator including a second electrode provided on a quartz-crystal piece;
   a first oscillator circuit connected to the first quartz-crystal resonator to oscillate the first quartz-crystal resonator with an overtone;
   a second oscillator circuit connected to the second quartz-crystal resonator to oscillate the second quartz-crystal resonator with an overtone;
   a frequency difference detecting part finding a value corresponding to a difference value between a value corresponding to a difference between f1 and f1r and a value corresponding to a difference between f2 and f2r, where f1 is an oscillation frequency of the first oscillator circuit, f1r is an oscillation frequency of the first oscillator circuit at a reference temperature, f2 is an oscillation frequency of the second oscillator circuit, and f2r is an oscillation frequency of the second oscillator circuit at the reference temperature; and
   a correction value obtaining part which, based on the value corresponding to the difference value detected by the frequency difference detecting part and a relation between the value corresponding to the difference value and a frequency correction value of the oscillation frequency f1 of the first oscillator circuit, obtains the frequency correction value of f1 ascribable to a difference between the environmental temperature and the reference temperature,
   wherein an output of the first oscillator circuit is used to generate an output of the oscillation device,
   wherein, based on the frequency correction value found by the correction value obtaining part, the output frequency is corrected, and
   wherein the value corresponding to the difference value between the value corresponding to the difference between f1 and f1r and the value corresponding to the difference between f2 and f2r is [{(f2 - f2r)f2r} - {(f1 - f1r)f1r}].

2. An oscillation device correcting an output frequency based on a detection result of an environmental temperature, the oscillation device comprising:

a first quartz-crystal resonator including a first electrode provided on a quartz-crystal piece;

a second quartz-crystal resonator including a second electrode provided on a quartz-crystal piece;

a first oscillator circuit connected to the first quartz-crystal resonator to oscillate the first quartz-crystal resonator with an overtone;

a second oscillator circuit connected to the second quartz-crystal resonator to oscillate the second quartz-crystal resonator with an overtone;

a frequency difference detecting part finding a value corresponding to a difference value between a value corresponding to a difference between f1 and f1r and a value corresponding to a difference between f2 and f2r; where f1 is an oscillation frequency of the first oscillator circuit, f1r is an oscillation frequency of the first oscillator circuit at a reference temperature, f2 is an oscillation frequency of the second oscillator circuit, and f1r is an oscillation frequency of the second oscillator circuit at the reference temperature; and a correction value obtaining part which, based on the value corresponding to the difference value detected by the frequency difference detecting part and a relation between the value corresponding to the difference value and a frequency correction value of the oscillation frequency f1 of the first oscillator circuit, obtains the frequency correction value of f1 ascribable to a difference between the environmental temperature and the reference temperature, wherein an output of the first oscillator circuit is used to generate an output of the oscillation device, wherein, based on the frequency correction value found by the correction value obtaining part, the output frequency is corrected, wherein an order of the overtone oscillated by the first oscillator circuit and an order of the overtone oscillated by the second oscillator circuit are equal to each other, and wherein the first quartz-crystal resonator and the second quartz-crystal resonator are different in at least one of a film thickness of the electrode, an area of the electrode, and a thickness of the quartz-crystal piece.

3. An oscillation device correcting an output frequency based on a detection result of an environmental temperature, the oscillation device comprising:

a first quartz-crystal resonator including a first electrode provided on a quartz-crystal piece;

a second quartz-crystal resonator including a second electrode provided on a quartz-crystal piece;

a first oscillator circuit connected to the first quartz-crystal resonator to oscillate the first quartz-crystal resonator with an overtone;

a second oscillator circuit connected to the second quartz-crystal resonator to oscillate the second quartz-crystal resonator with an overtone;

a frequency difference detecting part finding a value corresponding to a difference value between a value corresponding to a difference between f1 and f1r and a value corresponding to a difference between f2 and f2r; where f1 is an oscillation frequency of the first oscillator circuit, f1r is an oscillation frequency of the first oscillator circuit at a reference temperature, f2 is an oscillation frequency of the second oscillator circuit, and f2r is an oscillation frequency of the second oscillator circuit at the reference temperature; and a correction value obtaining part which, based on the value corresponding to the difference value detected by the frequency difference detecting part and a relation between the value corresponding to the difference value and a frequency correction value of the oscillation frequency f1 of the first oscillator circuit, obtains the frequency correction value of f1 ascribable to a difference between the environmental temperature and the reference temperature, wherein an output of the first oscillator circuit is used to generate an output of the oscillation device, wherein, based on the frequency correction value found by the correction value obtaining part, the output frequency is corrected, and wherein an order of the overtone oscillated by the first oscillator circuit and an order of the overtone oscillated by the second oscillator circuit are different from each other.

4. The oscillation device according to claim 1, wherein the quartz-crystal piece of the first quartz-crystal resonator and the quartz-crystal piece of the second quartz-crystal resonator are common.

5. The oscillation device according to claim 2, wherein the quartz-crystal piece of the first quartz-crystal resonator and the quartz-crystal piece of the second quartz-crystal resonator are common.

6. The oscillation device according to claim 3, wherein the quartz-crystal piece of the first quartz-crystal resonator and the quartz-crystal piece of the second quartz-crystal resonator are common.

7. The oscillation device according to claim 2, wherein the value corresponding to the difference value between the value corresponding to the difference between f1 and f1r and the value corresponding to the difference between f2 and f2r is [{(f2-f2r)/f2r}- {(f1-f1r)/f1r}].

8. The oscillation device according to claim 3, wherein the value corresponding to the difference value between the value corresponding to the difference between f1 and f1r and the value corresponding to the difference between f2 and f2r is [{(f2-f2r)/f2r}-{(f1-f1r)/f1r}].

* * * * *

UNITED STATES PATENT AND TRADEMARK OFFICE
CERTIFICATE OF CORRECTION

| | | |
|---|---|---|
| PATENT NO. | : 8,581,671 B2 | Page 1 of 1 |
| APPLICATION NO. | : 13/356764 | |
| DATED | : November 12, 2013 | |
| INVENTOR(S) | : Kazuo Akaike et al. | |

It is certified that error appears in the above-identified patent and that said Letters Patent is hereby corrected as shown below:

In the Claims

Col. 14 line 45, Claim 1: change "between l2 and f2r, where" to -- between f2 and f2r, where --.

Col. 15 lines 25-26, Claim 2: change "and f1r is an oscillation" to -- and f2r is an oscillation --.

Signed and Sealed this
Twenty-fifth Day of March, 2014

Michelle K. Lee
*Deputy Director of the United States Patent and Trademark Office*